United States Patent [19]

Koike

[11] 3,922,710

[45] Nov. 25, 1975

[54] SEMICONDUCTOR MEMORY DEVICE

[75] Inventor: Susumu Koike, Fujiidera, Japan

[73] Assignee: Matsushita Electronics Corporation, Kadoma, Japan

[22] Filed: May 2, 1974

[21] Appl. No.: 466,319

Related U.S. Application Data

[63] Continuation of Ser. No. 314,901, Dec. 13, 1972, abandoned.

[30] Foreign Application Priority Data

Dec. 17, 1971 Japan .............................. 46-103082
Dec. 17, 1971 Japan .............................. 46-103083

[52] U.S. Cl. ...................... 357/54; 357/12; 357/13; 357/23

[51] Int. Cl.[2] ............... H01L 29/88, H01L 29/90; H01L 29/78; H01L 29/34

[58] Field of Search .................... 357/12, 13, 23, 54

[56] References Cited

UNITED STATES PATENTS

| | | | |
|---|---|---|---|
| 3,411,053 | 11/1968 | Wiesner | 357/13 |
| 3,444,442 | 5/1969 | Yanagawa | 357/13 |
| 3,665,423 | 5/1972 | Nakanuma et al. | 340/173 R |

FOREIGN PATENTS OR APPLICATIONS

| | | | |
|---|---|---|---|
| 813,537 | 5/1969 | Canada | 357/54 |

*Primary Examiner*—John S. Heyman
*Assistant Examiner*—E. Wojciechowicz
*Attorney, Agent, or Firm*—Ladas, Parry, Von Gehr, Goldsmith & Deschamps

[57] ABSTRACT

A first thin insulating film capable of being pierced or punched through by carriers such as an $SiO_2$ film 20 A thick is deposited on the surface of a P-type silicon substrate and a second insulating film with a trap level such as an $Si_3N_4$ film 500 to 600 A thick is laid on the first insulating film. Upon application of an electric field through a metal electrode mounted on the second insulating film to the combination of the insulating films, electrons captured at the trap level of the second insulating film transfer through the first insulating film to the surface of the substrate thereby forming an inversion layer. When the inversion layer is connected with the two junction regions formed in the surface of the substrate, the reverse current level of the junction region increases semipermanently due to the breakdown voltage of the junction until the inversion layer is cancelled by the application of a reverse electric field. This principle is used to produce a memory device characterized by an exact operation comprising a semiconductor, the first thin insulating film, the second insulating film with a trap level, the second insulating film, the metal electrode and two PN junctions which have different junction breakdown voltages.

6 Claims, 8 Drawing Figures

SEMICONDUCTOR MEMORY DEVICE

This is a continuation, of application Ser. No. 314,901 filed Dec. 13, 1972, and now abandoned.

The present invention relates to a memory device with a semiconductor or more in particular to a device in a laminated metal-insulator-semiconductor for storing information signals, and two junctions with different breakdown voltages for reading out the signals.

Well known conventional typical memory devices of this type include a magnetic core type memory element using the hysteresis of magnetism or a memory means utilizing the fundamental principle of the transistor flip-flop operation. Of these devices, the former has the disadvantages of response time as long as $10^{-4}$ to $10^{-2}$ seconds and the likelihood of the memory being easily disturbed in reading it out, while on the other hand, the latter device, in spite of its short response time of $10^{-8}$ seconds, requires a power supply for such period to maintain the memory condition and also it must be supplied with 6 to 8 transistors for one bit, resulting in a low practical value. Some of the recently developed memory devices of this type use a field effect transistor developed as a semiconductor circuit element. Highly skilled workmanship is required, however, for the manufacture of the field effect transistor and in addition the scanning circuit for reading and writing a memory signal is so complicated that a large number of circuit elements are required, making the circuit configuration thereof almost the same as that of a transistor circuit.

Accordingly, it is an object of the present invention to provide a convenient memory device of a simple structure with a semiconductor.

Another object of the invention is to provide not only a memory device which requires no power supply for semi-permanently maintaining the memory condition as in the conventional device but also substantially a memory element using one active element for one bit.

According to the invention, a semiconductor substrate has on its surface a junction region of a conductivity different from that of the substrate, and a first insulating film so limited in thickness as to be punched through by carriers and a second insulating film with a trap level formed on the first insulating film are laminated on the portion of the surface of the substrate in the neighborhood of the junction region. Application of electric field causes carriers entrapped in the second insulating film to be sent through the first insulating film to the surface of the substrate, so that an inversion layer is formed in the surface of the substrate and connected with the junction region thereby to increase the reverse current flowing to the junction region. The operation of the device according to the invention is so simple that the writing of a signal is effected by application of electric field to the insulating films. Further, it is easy to read out a signal, which is semi-permanently memorized so far as it is not erased.

The above and other objects, features and advantages will be made apparent by the detailed description taken in conjunction with the accompanying drawings, in which.

Figure 1:
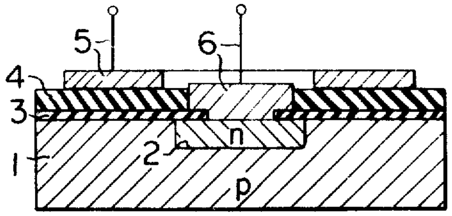
FIG. 1 is a diagram showing a sectional view of a known type of device for comparative purposes.

Referring to FIG. 1 the reference numeral 1 shows a P-type silicon substrate, and the numeral 2 and N-type impurities-diffused region formed on part of the surface of the P-type silicon substrate thereby to form a PN junction. On the other surface of the substrate 1 is formed a lamination comprising a thin silicon dioxide film 3 and an insulating film 4 of $Si_3N_4$ with a trap level. Further, on this laminated structure are laid an annular metal electrode 5 and a metal electrode 6 in ohmic contact with the diffused region 2.

Figure 2:
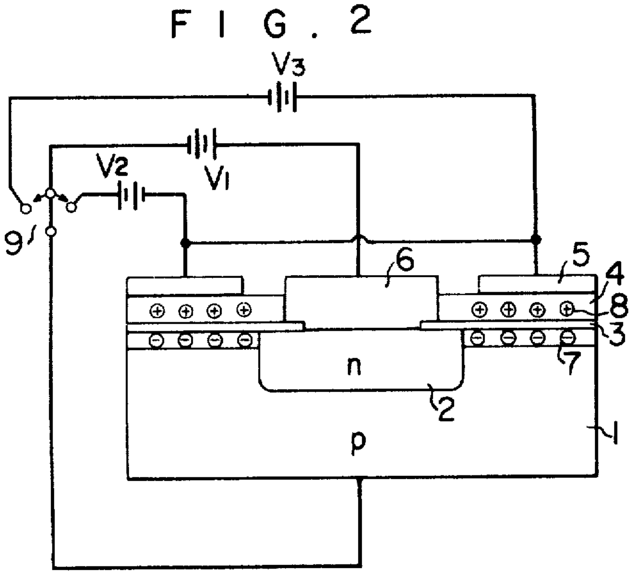
FIG. 2 is a diagram showing a circuit construction for explaining the operating principle of the device of FIG. 1.

The operation of the device mentioned above will be now explained with reference to FIG. 2.

1. First, a reverse voltage from the power supply $V_1$ is applied to the N-type region 2 through the metal electrode 6 thereby to bias the PN junction in the reverse direction. Under this condition, there exists in the PN junction a reverse saturation current of only several nanoamperes.

2. A voltage which is negative as viewed from the substrate and which is generated by the power supply $V_2$ is applied to the metal electrode 5 on the insulating film. The resulting electric field causes electrons in the trap level in the insulating film 4 of $Si_3N_4$ to be injected into the surface of the substrate 1 through the silicon dioxide film 3 as a result of the tunnel effect. Under this condition, an inversion layer 7 is formed in the surface of the P-type substrate under the interface by means of the injected electrons.

From the standpoint of a memory device, the condition (1) above indicates "not memorized or zero" while the condition (2) denotes "a signal written or 1."

When the voltage $V_2$ applied through the metal electrode 5 is eliminated, the injected electrons, for lack of any electric field, are incapable of recombination by returning to the hollow trap level in the silicon nitride film 4 through the silicon dioxide film 3. Instead, the electrons are maintained in the form of the inversion layer 7 in the interface between the substrate and the silicon dioxide film by being attracted toward the positive charge layer 8. The length of time during which this condition continues depends upon the life time of the trap of electrons in the silicon nitride film 4. The trap is at a deep level and is sustained for such a long time that according to our tests no change was observed even after 4000 hours.

Figure 3:
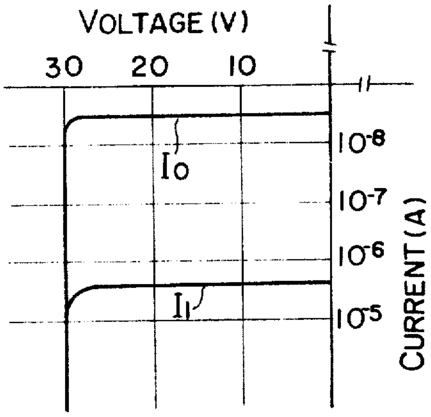
FIG. 3 illustrates typical characteristic curve of the device according to the device shown in FIG. 1.

The detection of a signal thus written or the reading operation is effected by measuring the reverse current in the PN junction. In other words, the writing negative voltage $V_2$ applied through the metal electrode 5 is cut off and under this condition the reverse voltage $V_1$ is applied to the PN junction through the metal electrode 6, with the result that the level of the reverse saturation current in the PN junction remarkably increases due to the presence of the inversion layer 7. Incidentally, the reference numeral 9 in the drawing shows a three-way switch. The results of such measurements are shown in the characteristic diagram of FIG. 3, in which Curve $I_0$ indicates "not memorized" and Curve $I_1$ the characteristic under the condition of "a signal written."

A method of manufacturing the device shown in FIG. 1 is illustrated below.

The substrate 1 consists of P-type silicon $2 \times 10^{15}$ atoms/$cm^3$ in impurities concentration, and on the (100) plane thereof is formed a thick film of masking material of silicon dioxide. A diffusing window is bored in the silicon dioxide film and through this window phosphorus is selectively diffused thereby to form the N-type region 2 which is 6 microns thick. This region 2 should preferably be formed in a circle about 100 to 500 microns in diameter and 3 to 10 microns in depth.

After that, the masking material is removed and an insulating film 3 of silicon dioxide 20 A thick is formed by vapor-phase deposition. The thickness of the insulating film 3 is limited such as to enable the punching therethrough of electrons by tunnel effect and is practically 100 A or below.

A silicon nitride film 4 500 A to 600 A thick is deposited on the silicon dioxide insulating film 3 by thermodecomposition of vapor phase ammonium silanes. This process was followed by forming the metal electrodes 5 and 6 by deposition of aluminum and photoetching operation.

The voltage $V_1$ of 15 volts and the current $I_0$ of 0.5 nano-ampere were observed under the "not memorized" state, whereas under the condition of "signal written" with the negative voltage $V_2$ of 20 volts applied, the application of $V_1$ of 15 volts to the junction cutting off the negative voltage $V_2$ resulted in the increase in current level $I_1$ to 0.1$\mu$A by three orders of magnitude.

In place of P-type silicon employed in the substrate 1 of the above-described embodiment, the same effect is achieved by using N-type silicon, in which case the inversion layer 7 becomes a positive layer and the second insulating film should have an acceptor level. As an example, insulating film 4 consisting of $TiO_2$, $HfO_2$, $Ta_2O_3$ or $Al_2O_3$ is deposited on silicon oxide film 3 thereby to form a deep acceptor level in the silicon nitride insulating film 4. It is needless to say in this case that the voltage is applied in the other direction because of the inversed conductivity.

Figure 4:
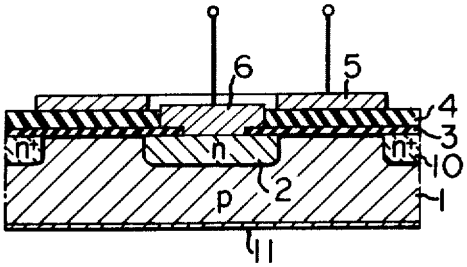
FIG. 4 is a diagram showing a sectional view of the structure of one embodiment of the invention.
Figure 5:
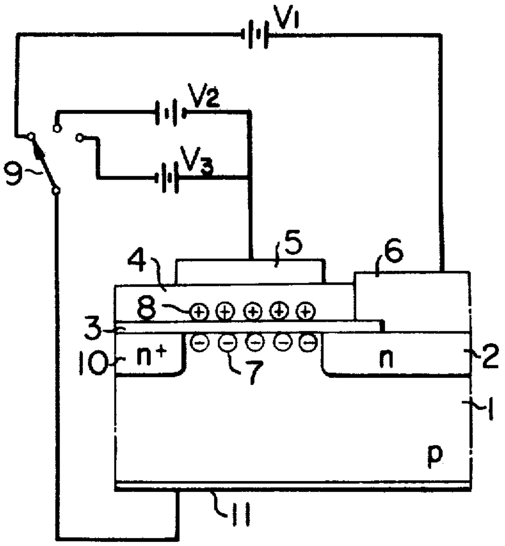
FIG. 5 shows a circuit construction for explaining the principle on which the device according to the invention operates.
Figure 6:
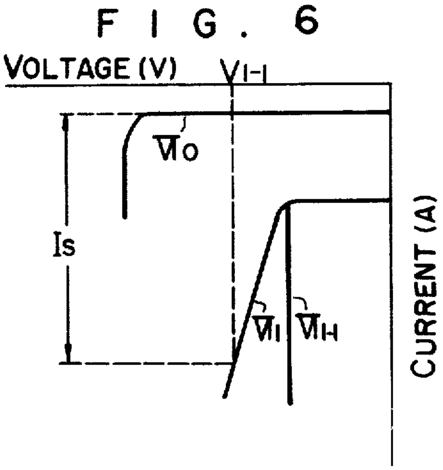
FIG. 6 is a diagram showing typical characteristics of the device according to the invention shown in FIG. 5.

An embodiment of the present invention is shown in FIGS. 4 and 5, which is different from the device of FIG. 1 in that in this embodiment in addition to the diffused region 2 constituting the PN junction in the surface of the substrate 1, there is provided an $N^+$-type region 10 with stepped structure of high concentration. In this embodiment, formation of the inversion layer 7 by a writing operation causes conduction to take place between the N-type diffused region 2 and the $N^+$-type region 10. In this case, the breakdown voltage is concerned not only with the reverse strength of the N-type region 2 but with the reverse breakdown strength of the $N^+$-type region 10 and as a result is controlled by the N-type region 2 or the $N^+$-type region 10, whichever is lower in reverse breakdown strength. If the breakdown strength of the $N^+$-type region 10 is reduced by forming it into a stepped junction, the characteristics as shown in FIG. 6 are obtained. When a read-out signal of reverse bias voltage $V_{1\text{-}1}$ is applied to the junction through the metal electrode 6 for reading out a signal which has been written by forming the inversion layer 7 in the interface of the substrate 1 as a result of application of the negative voltage $V_2$ to the metal electrode 5, current of the characteristics of the curve $VI_1$ of FIG. 6 is generated. This current is considerably increased due to the breakdown of the junction between the $N^+$-type regioon 10 and the substrate 1. Thus, the use of the breakdown of the $N^+$-type region 10 permits a read output signal, that is, reading current $I_s$ to be much higher than the reverse saturation current which occurs due to the mere formation of the inversion layer 7.

In this case, too, the breakdown current becomes constant due to the process of resistance in the inversion layer 7. This resistance may be reduced further by controlling such factors as nature and size of the semiconductor substrate and manufacturing conditions, whereby the output current conforms to the characteristic curve $VI_{1\text{-}1}$ of FIG. 6, thus enabling the voltage across the electrodes 6 and 11 to be maintained constant.

The Curve $VI_0$ in FIG. 6 shows the characteristic of reverse saturation current under the "not memorized" state.

The method by which the device of FIG. 4 is produced is explained below.

A thick masking film of $SiO_2$ is formed on the surface of the P-type silicon substrate with the impurities concentration of $2 \times 10^{15}$ atoms/$cm^3$ by utilizing the (100) plane thereof, and phosphorus is diffused through a diffusing window about 100 to 500 microns in dia. bored in the thick film thereby to form a region 2 which is 3 to 10 microns deep.

A masking film of silicon dioxide is again deposited over the entire surface of the substrate and then a diffusing window is bored for forming the $N^+$-type region 10, through which window the region 10 with the surface concentration of $1 \times 10^{20}$ atoms/$cm^3$ or more and the junction depth of 1 to 5 microns is formed. When the region 10 is formed by diffusion, the diffusion of the already formed region 2 is promoted further and as a result the gradient of the impurity concentration at the PN junction between the region 2 and the substrate is reduced to about $2 \times 10^{21}$ atoms/$cm^4$, which in turn results in the reverse breakdown strength of the first diffused region 2 being about 30 volts, while that of the second diffused region 10 is reduced to about 10 volts.

After removing the masking material of silicon dioxide from the surface of the substrate, the silicon dioxide film 3 about 20 A thick and the silicon nitride film 4 which is 500 to 600 A thick are deposited in this order in the same way as in the preceding embodiment, followed by the deposition by evaporation of the aluminum metal electrodes 5 and 6. Incidentally, the gold-gallium alloy layer 11 which constitutes an electrode for the substrate 1 was fomed on the back of the substrate.

This device has the same characteristics as the one shown in FIG. 6, and it was ascertained that in this device the saturation current under the "not memorized" state represented by the Curve $VI_0$ is 0.5 nanoampere, whereas the read-out current $I_s$ for 12 volts of $V_{1\text{-}1}$ after writing at −18 volts of $V_2$ is 5 mA, showing that this device has a high practical value.

Figure 7:
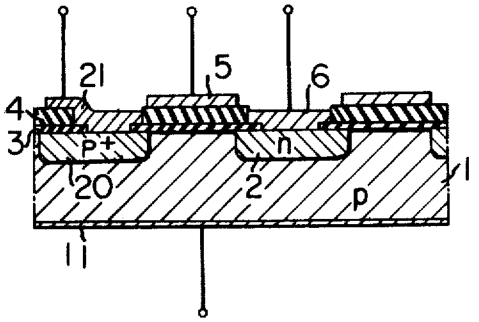
FIG. 7 is a diagram showing a sectional view of the structure of another embodiment of the invention.
Figure 8:
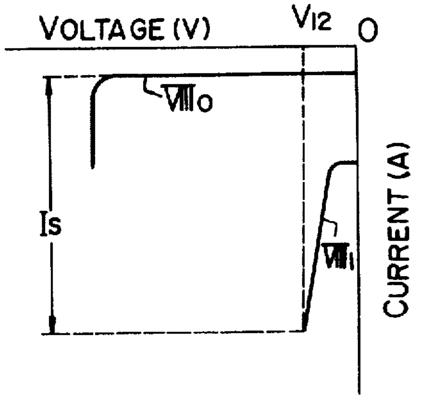
FIG. 8 is a diagram showing typical characteristics of the device of FIG. 7.

Another embodiment of the invention is illustrated in FIG. 7. In this embodiment, the $N^+$-type region 10 is replaced by the $P^+$-type region 20, and the metal electrode 21 on the $P^+$-type region 20 acts as a signal read-out electrode, so that the writting and erasing operations are performed by the voltage applied between the metal electrode 5 and the contact or electrode 11 on the back of the substrate 1, while the reading operation is effected by the voltage $V_{1\text{-}2}$ applied between the metal electrode 21 on the $P^+$-type region and the metal electrode 6 on the $N^+$-type region 2. In other words, as seen from the characteristics shown in FIG. 8, even if the saturation current characteristic thereof is represented by Curve $VII_0$, an inversion layer formed on the surface of the substrate 1 by a writing operation causes the $N^+$-type region 2 to be electrically connected with the $P^+$-type region 20, and as a result a breakdown occurs between the $P^+$-type region 20 and the $N^+$-type region 2 at a very low voltage as shown by the characteristic curve $VIII_1$ of FIG. 8. Accordingly, a very low reading voltage $V_{1\text{-}2}$ suffices in this device compared with the voltage $V_{1\text{-}1}$ for the device of FIG. 6.

The operation for erasing the written signal is easily accomplished for both the first and second embodiments by applying the voltage $V_3$ between the metal electrode 5 and the electrode 11 on the back of the substrate which is reverse in direction to the negative voltage $V_1$ used for writing operation. Also, in place of the P-type substrate used in the second and third embodiments above, an N-type substrate may be employed without departing from the spirit of the invention. In such a case, silicon dioxide is used as a thin insulating film 3 capable of being punched through by carriers, and an insulating material with an acceptor level such as $TiO_2$, $HfO_2$, $Ta_2O_3$ or $Al_2O_3$ should be employed as an insulating film 4 with a trap level formed on the insulating film 3. As will be understood from the detailed description taken above, the memory device according to the present invention is capable of writing and reading operations with one bit per active element and provides a very simple construction of the memory element. Further, information is kept in memory semi-permanently, eliminating any power supply for maintaining the memorized condition.

Another advantage of the invention is the ease with which the memory element is manufactured by the use of a conventional method of manufacture of semiconductors, thus making the device of the invention suitable for purposes of not only a memory for a large quantity of information but a highly integrated memory used with a large-sized computer and a desk-top electronic calculator.

What we claim is:

1. A semiconductor memory device comprising:

a. a semiconductor substrate of one conductivity type;

b. first and second semiconductor regions of the opposite conductivity type to that of said substrate, formed in the surface of said substrate and forming first and second PN junctions with said substrate, respectively, the breakdown voltage of said first PN junction being higher than that of said second PN junction;

c. a laminated structure formed on the surface of said substrate between said first and second semiconductor regions, the laminated structure including a first insulting film having a thickness within the tunneling distance of charge carriers under the application of a predetermined voltage, and a second insulting film formed on said first insulating film, said second insulating film forming trapping centers near the interface between said first and second insulating films;

d. signal writing means disposed on said laminated structure for applying thereto a voltage signal above said predetermined voltage; and e. signal reading means disposed on said first semiconductor region for deriving the signal stored in the memory.

2. A memory device according to claim 1, in which said semiconductor substrate consists of P-type silicon, said first insulating film consists of silicon dioxide not thicker than 100 A and said second insulating film consists of silicon nitride.

3. A memory device according to claim 2, in which said second junction region includes at least one heavily doped region disposed in the substrate adjacent its surface.

4. A memory device according to claim 3, in which said heavily doped region is of n conductivity type.

5. A semiconductor memory device according to claim 1, wherein said second semiconductor region has a depth smaller than that of said first semiconductor region and said second PN junction is a step junction.

6. A semiconductor memory device according to claim 5, wherein said first and second semiconductor regions are separated apart and said laminated structure has portions overlapping said first and second semiconductor regions.

* * * * *